United States Patent [19]

Aigo

[11] Patent Number: 4,600,463
[45] Date of Patent: Jul. 15, 1986

[54] TREATMENT BASIN FOR SEMICONDUCTOR MATERIAL

[76] Inventor: Seiichiro Aigo, 3-15-13 Negishi, Daito-ku, Tokyo, Japan

[21] Appl. No.: 688,886

[22] Filed: Jan. 4, 1985

[51] Int. Cl.[4] .......................... B44C 1/22; C03C 15/00; C03C 25/06; H01L 21/306
[52] U.S. Cl. .................................. 156/345; 156/640; 156/642; 269/21
[58] Field of Search .............. 156/345, 639, 640, 642, 156/644, 662; 269/20, 21; 118/300; 134/21, 23, 33, 149, 157

[56] References Cited

U.S. PATENT DOCUMENTS

| | | | |
|---|---|---|---|
| 2,523,018 | 9/1950 | Henderson | 156/641 |
| 4,021,279 | 5/1977 | Hirs | 156/654 |
| 4,165,252 | 8/1979 | Gibbs | 156/642 X |
| 4,339,297 | 7/1982 | Aigo | 156/345 |
| 4,350,562 | 9/1982 | Bonu | 156/345 X |

Primary Examiner—William A. Powell

[57] ABSTRACT

The present invention relates a basin for applying a treatment such as development, etching or plating to one of surfaces of a semiconductor material. A treatment liquid is introduced through a passage formed in a lower part of the basin. Then, the treatment liquid is blown upwardly against the semiconductor material held spacedly above a top portion of the basin. The top portion of the basin centrally defines a hole permitting the passage of the treatment liquid therethrough and is formed into a table surface having an area wider than the one surface of the semiconductor material. At the outer circumferential edge of the semiconductor material, the treatment liquid is allowed to flow in a laminar state outwardly along the table surface. Thus, the treatment liquid is prevented from running astray onto the rear surface of the semiconductor material. Since the treatment liquid is caused to flow between the semiconductor material and the table surface, good contact is maintained between the semiconductor material and the treatment liquid and the semiconductor can be kept free from air and gas bubbles which would otherwise stick on the semiconductor surface.

4 Claims, 4 Drawing Figures

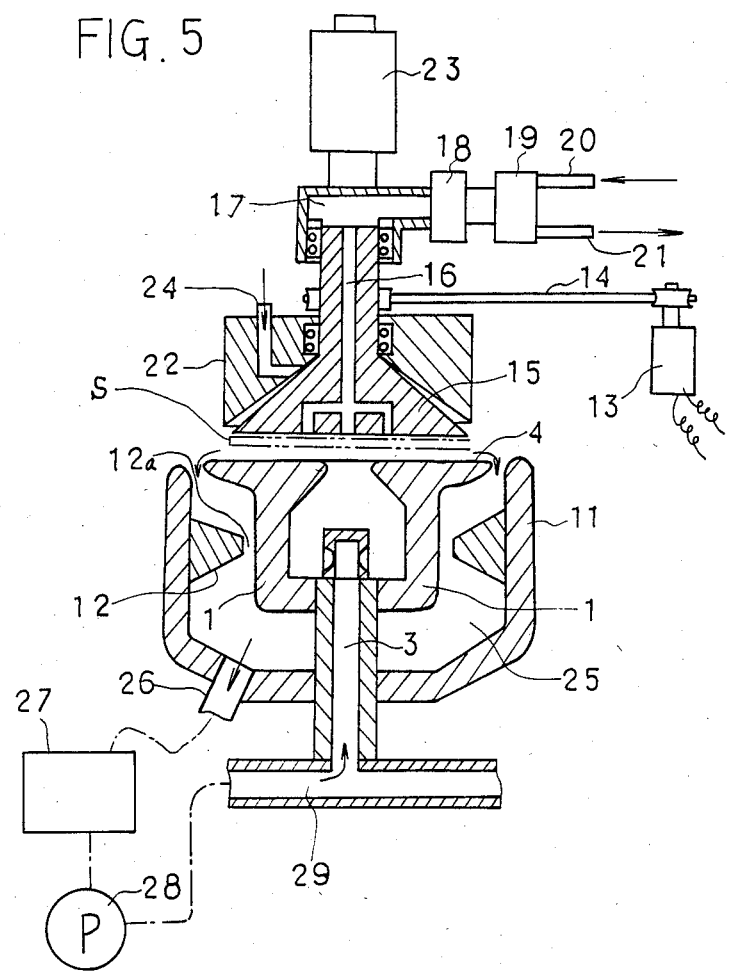
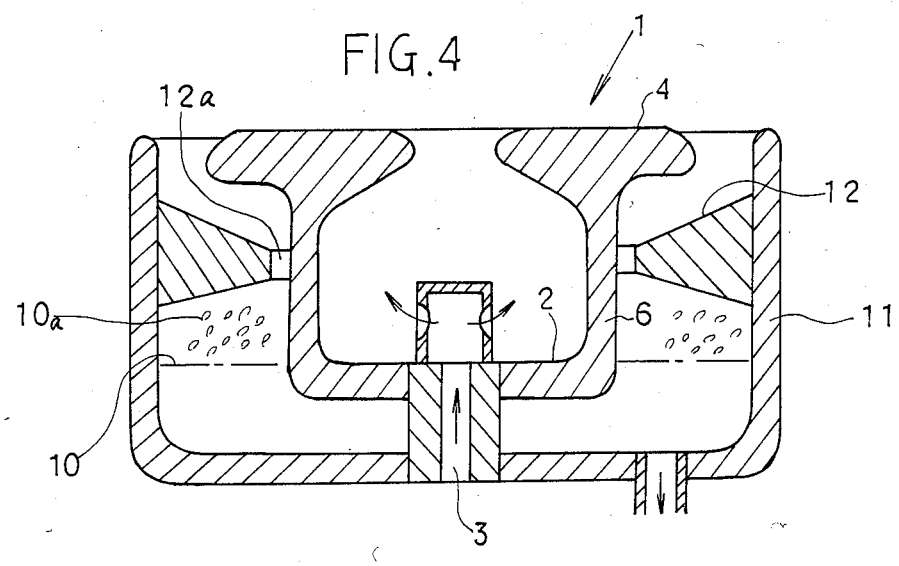

TREATMENT BASIN FOR SEMICONDUCTOR MATERIAL

BACKGROUND OF THE INVENTION

1. Field of the Invention

This invention relates to an apparatus for treating a semiconductor material such as silicon wafer or glass photomask, and more particularly to a basin for blowing a treatment liquid upwardly against one of surfaces of such a semiconductor material. 2. Description of the Prior Art Conventional basins of the above sort are each equipped at a lower part thereof with a passage for introducing a treatment liquid thereinto. In combination with each of such conventional basins, a vacuum chuck is employed to suck the semiconductor material thereon by virtue of vacuum and to support the semiconductor material above the basin. Against the semiconductor material supported with one of its surfaces down, said one surface being to be treated, the treatment liquid is blown upwardly so as to bring the treatment liquid into contact with the one surface of the semiconductor material. The treatment liquid which has overflown a top portion of the basin, is then received in a gutter arranged along the circumference of the basin. The thus-received treatment liquid is then returned to a reservoir so as to circulate the treatment liquid. Such conventional basins have cup-like shapes, and nitrogen gas is blown against upper peripheral portions of semiconductor materials placed above the basins so as to prevent the treatment liquid from running astray onto the upper, namely, the rear surfaces of the semiconductor materials.

Due to the cup-like configurations of the conventional basins, the treatment liquid tends to run astray onto the rear surface of each material under treatment. It is thus indispensable to blow nitrogen gas against the material. In addition, the treatment liquid which has hit the intended, namely, the lower surface of the semiconductor material is then converted into a stream flowing along the lower surface of the semiconductor material and another stream splashing back in the downward direction, whereby developing a problem that the treatment liquid cannot be brought into stable contact with the lower surface of the material. Furthermore, bubbles of a gas produced in the course of the reaction between the treatment liquid and the semiconductor material as well as bubbles present in the blown-up treatment liquid tend to stick the semiconductor material. The kinetic energy of the upward stream of the treatment liquid, which has been blown up, is however too small to wash away such bubbles, leading to uneven progress of the reaction due to such bubbles.

SUMMARY OF THE INVENTION

An object of this invention is to solve the above-described drawbacks of the prior art techniques, and thus to provide a treatment basin of such a structure that can prevent the treatment liquid from flowing astray onto the rear surface of the semiconductor material and can also avoid the deposition or sticking of bubbles on the front surface of the semiconductor material, and can hence achieve appropriate contact between the front surface of the semiconductor material and the treatment liquid.

In one aspect of this invention, there is thus provided a basin for applying a treatment such as development, etching or plating to one of surfaces of a semiconductor material, which is supported spacedly above a top portion of the basin with the one surface down, by introducing a treatment liquid through a passage formed in a lower part of the basin and then blowing the treatment liquid upwardly against the one surface of the semiconductor material. The top portion of the basin centrally defines a hole permitting passage of the treatment liquid therethrough and is equipped with a table surface wider than the area of the one surface of the semiconductor material.

According to the present invention, the treatment liquid is allowed to flow between the lower surface of the semiconductor material and the table surface downwardly coextensive with the lower surface of the semiconductor material. While flowing there, the treatment liquid is kept in contact with the lower surface of the semiconductor material. Therefore, the contact is achieved efficiently and the flow of the treatment liquid can wash away gas bubbles from the lower surface of the semiconductor material, thereby carrying out a uniform treatment. Furthermore, the treatment liquid is prevented from running astray onto the rear, namely, the upper surface of the semiconductor material.

The above and other objects, features and advantages of the present invention will become apparent from the following description and the appended claims, taken in conjunction with the accompanying drawings.

BRIEF DESCRIPTION OF THE DRAWINGS

In the accompanying drawings:

FIG. 4 is a vertical cross-sectional view of a treatment basin according to another embodiment of this invention; and FIG. 5 is a vertical cross-sectional view of an etching apparatus in which a basin according to this invention has been incorporated.

DETAILED DESCRIPTION OF THE INVENTION AND PREFERRED EMBODIMENTS

Figure 1:
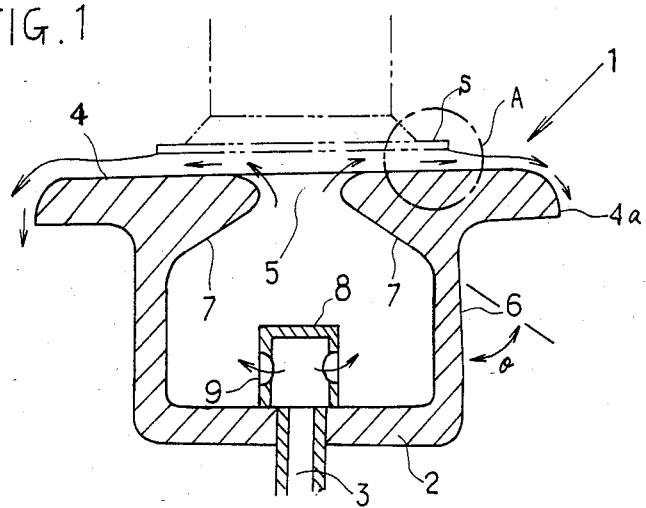
FIG. 1 is a vertical cross-sectional view of a treatment basin according to one embodiment of this invention.
Figure 2:
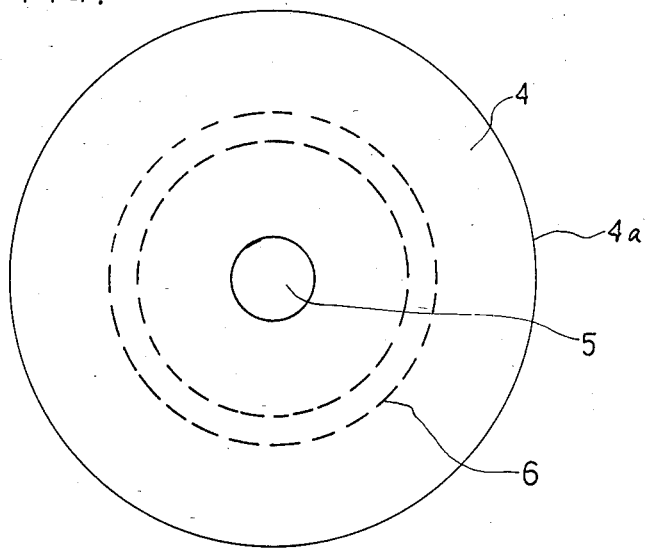
FIG. 2 is a top plan view of the treatment basin.

Preferred embodiments of this invention will hereinafter be described with reference to the accompanying drawings. FIGS. 1 and 2 illustrate one embodiment of this invention. As shown there, a basin 1 is equipped in a lower part 2 thereof with a passage 3 for introducing a treatment liquid thereinto. In the illustrated embodiment, the top portion of the basin 1 is formed into a table surface 4 which is an annular surface. The circumferential edge 4a of the table surface 4 has a diameter greater than the outer diameter of a material S to be treated, such as a wafer or the like. Needless to say, it is not always essential that the outer circumferential edge of the table 4 has a circular contour. The treatment liquid is blown up through a hole 5 formed centrally through the table surface 4. The area of this hole 5 is also included in the area of the table surface 4.

Preferably, the inner surface of the top portion of the basin, in other words, a surface 7 extending on the inner wall of a circumferential side wall 6 of the basin and below the table surface 4 defines an upwardly-squeezed frustoconical surface extending toward the central hole 5. The angle $\theta$ of inclination of the upwardly-squeezed frustoconical surface is desirably from about 30° to about 60°. The upwardly-squeezed frustoconical surface has such a merit that it facilitates the washing-away of air bubbles occurred in the treatment liquid.

In a still preferred embodiment, the upper end 8 of the passage 3 is closed up and instead, openings 9 are formed through a passage-defining wall in the vicinity of the upper end 8 so that the treatment liquid is allowed to flow out through the openings 9. In this manner, the treatment liquid is caused to flow suitably along the frustoconical surface 7, which is located in an upper part within the basin 1, and is then blown upward through the hole 5.

The basin 1 is preferably made of Teflon, but other suitable materials may also be used to make up the basin 1. The semiconductor material S to be treated is supported, as seen in FIG. 1, with a small gap above the table surface 4 by means of a vacuum chuck or the like. The distance between the lower surface of the material S and the table surface 4 may generally range from 2 mm to 5 mm. This gap can however be determined to a suitable value in accordance with the viscosity of the treatment liquid.

Figure 3:
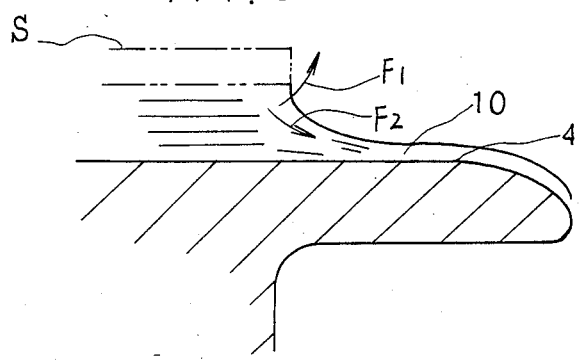
FIG. 3 is an enlarged fragmentary cross-sectional view of the treatment basin, corresponding to the portion indicated by a circle A in FIG. 1.

Since the material S to be treated is positioned very close to the table surface 4, a treatment liquid 10 is allowed to flow in a laminar state between the table surface 4 and the material S as shown in FIG. 3. Accordingly, the surface tension $F_1$ of the treatment liquid at the outer circumferential edge of the material S is cancelled out by the drawing force $F_2$ of the same treatment liquid which flows outwardly from the outer circumferential edge of the material S. Therefore, the treatment liquid is prevented from flowing astray onto the upper surface of the material S. Even if gas, which has occurred during the reaction between the treatment liquid and the material S, and/or air bubbles contained in the blown-up treatment liquid stick on the lower surface of the material S, they can be removed successfully because the lower surface of the material S is kept in contact with the treatment liquid flowing in a laminar state. Therefore, the treatment liquid is effectively and uniformly brought into contact with the material S. If desired, it is possible to arrange the basin 1 in a container 11 and to provide an annular lid 12 which extends inwardly from the circumferential side wall of the container, whereby to enclose the treatment liquid which has flown down from the table surface 4. In this manner, the lid 12 serves to isolate vapor 10a of the treatment liquid and the air from each other, thereby minimizing the contact of the treatment liquid with the air so as to retard the deterioration of the treatment liquid. The degree of this isolation can be determined by a clearance 12a between the inner circumferential edge of the lid 12 and the outer surface of the circumferential side wall 6 of the basin 1.

FIG. 5 illustrates one example of applications of the basin 1 according to this invention, in which the basin 1 is used for etching a wafer to open windows or perforations through an oxide film of the wafer. In the illustrated apparatus, a wafer S is supported above the basin 1 by means of a vacuum chuck 15 which is rotated via a belt 14 by a motor 13. A pipe 17, which is in communication with a passage 16 of the chuck 15, is provided with a pressure sensor 18 and valve 19. On the other hand, the valve 19 is in turn connected to a nitrogen gas feed line 20 and a suction line 21 kept in communication with vacuum means (not illustrated). In the drawing, numeral 22 indicates a holder which surrounds the upper surface of the chuck 15. Designated at numeral 23 is an air cylinder for lifting the chuck 15 slightly. The holder 22 defines a nitrogen gas feed channel 24 therethrough. Around the basin 1, a gutter 25 is arranged to catch the treatment liquid which has flown down from the table surface 4. The gutter 25 communicates to a reservoir 27 by way of a discharge line 26. Designated at numeral 28 is a pump, which feed the treatment liquid from the reservoir 27 to the passage 3 of the basin 1 via a feed line 29.

When etching a wafer, the wafer is placed with its front surface down on the table surface 4. Then, the chuck 15 is lowered to the rear surface, i.e., the upper surface of the wafer. When the chuck has approached close to the wafer, it is sensed by the pressure sensor 18 and the valve 19 is switched over to connect the suction line 21 with the passage 16. Thus, the wafer is sucked on the chuck 15 and is then held at a predetermined height above the table surface 4. Then, the etchant is introduced from the feed line 29 into the basin 1 via the channel 3 and is then blown upward. The etchant is thus caused to hit the lower surface of the wafer. After that, it flows outwardly between the lower surface of the wafer and the table surface 4 and drops downwardly into the gutter 25. The etchant is then returned to the reservoir 27 by way of the discharge line 26. The motor 13 is actuated from time to time so that the wafer is turned together with the chuck 15. This permits the removal of a gas which has occurred through the reaction between the etchant and the wafer and has built up around the center of the lower surface of the wafer.

Although etching has been effected in the above-described application example, the basin of this invention can also be used in much the same way for the development treatment of circuit patterns or bump-plating.

Having now fully described the invention, it will be apparent to one of ordinary skill in the art that many changes and modifications can be made thereto without departing from the spirit or scope of the invention as set forth herein.

What is claimed is:

1. In a basin for applying a treatment such as development, etching or plating to one of the surfaces of a semiconductor material, which is supported spacedly above a top portion of the basin with one surface facing downwardly, by introducing a treatment liquid through a passage formed in a lower part of the basin and then blowing the treatment liquid upwardly against the one surface of the semiconductor material, the improvement comprising the basin having a top portion, the inner surface of which frustoconically tapers upwardly and inwardly to a centrally defined hole permitting passage of the treatment liquid therethrough and the outer surface of which defines a table surface wider than the area of the one surface of the semiconductor material.

2. A basin as claimed in claim 1, wherein the table surface is an annular surface wider than the area of the one surface of the semiconductor material.

3. A basin as claimed in claim 1, wherein the basin is additionally equipped with a container surrounding the basin so as to catch the treatment liquid flown down from the table surface, and the container has an annular lid extending inwardly from the inner circumferential wall of the container, whereby to isolate vapor of the thus-caught treatment liquid from the air.

4. A basin as claimed in claim 1, wherein the passage is closed at the upper end thereof, and the wall, which defines the passage, defines at least one opening in the vicinity of the upper end thereof so that the treatment liquid is blown out through the opening.

* * * * *